(12) United States Patent
Han et al.

(10) Patent No.: US 10,690,838 B2
(45) Date of Patent: Jun. 23, 2020

(54) LIQUID CRYSTAL DISPLAY DEVICE AND BACKLIGHT MODULE

(71) Applicant: Wuhan China Star Optoelectronics Technology Co., Ltd., Wuhan, Hubei (CN)

(72) Inventors: Mei Han, Hubei (CN); Gege Zhou, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 335 days.

(21) Appl. No.: 15/735,030

(22) PCT Filed: Nov. 23, 2017

(86) PCT No.: PCT/CN2017/112697
§ 371 (c)(1),
(2) Date: Dec. 8, 2017

(87) PCT Pub. No.: WO2019/095421
PCT Pub. Date: May 23, 2019

(65) Prior Publication Data
US 2020/0033531 A1     Jan. 30, 2020

(30) Foreign Application Priority Data

Nov. 17, 2017   (CN) .......................... 2017 1 1146635

(51) Int. Cl.
*F21V 21/00*     (2006.01)
*F21V 8/00*      (2006.01)
(Continued)

(52) U.S. Cl.
CPC .......... *G02B 6/0083* (2013.01); *G02B 6/0086* (2013.01); *G02F 1/133308* (2013.01);
(Continued)

(58) Field of Classification Search
CPC .. G02B 6/0083; G02B 6/0086; H05K 1/0274; H05K 1/189; H05K 2201/10106
(Continued)

(56) References Cited

U.S. PATENT DOCUMENTS 8,197,081 B2 *   6/2012   Cho ..................... G02B 6/0068
                                                    362/613
8,836,894 B2 *   9/2014   Gu ....................... G02B 6/0035
                                                    349/65
(Continued)

FOREIGN PATENT DOCUMENTS

CN           2738273 Y      11/2005
CN         101625464 A       1/2010
(Continued)

*Primary Examiner* — Laura K Tso
(74) *Attorney, Agent, or Firm* — Hemisphere Law, PLLC; Zhigang Ma

(57) ABSTRACT

A liquid crystal display device and a backlight module are provided. The backlight module includes a frame, a light source, and a light guide plate. The light guide plate includes a light incident surface, a bottom portion and a top portion. The frame includes a lateral plate disposed opposite to the light incident surface. The light source includes a flexible printed circuit and a LED, and the flexible printed circuit includes a vertical portion and a first horizontal portion, wherein the vertical portion is disposed between the lateral plate and the light incident surface, the LED is disposed on a surface of the vertical portion facing the light guide plate, and the first horizontal portion is a part of the vertical portion bending toward the light guide plate. By practice of the disclosure, the narrow border design of the liquid crystal display device could be achieved.

9 Claims, 1 Drawing Sheet

(51) Int. Cl.
*G02F 1/1333* (2006.01)
*H05K 1/02* (2006.01)
*H05K 1/18* (2006.01)

(52) U.S. Cl.
CPC ......... *H05K 1/0274* (2013.01); *G02B 6/0055* (2013.01); *G02F 2001/133314* (2013.01); *H05K 1/189* (2013.01); *H05K 2201/10106* (2013.01)

(58) Field of Classification Search
USPC .................................... 362/612, 613, 97.3
See application file for complete search history.

(56) References Cited

U.S. PATENT DOCUMENTS

| | | | | |
|---|---|---|---|---|
| 8,858,007 | B2* | 10/2014 | Kim | ............ H05K 1/0203 362/613 |
| 2008/0225203 | A1* | 9/2008 | Kim | ............ G02B 6/0031 349/65 |
| 2012/0243261 | A1* | 9/2012 | Yamamoto | .......... H01L 25/0753 362/613 |
| 2013/0051073 | A1* | 2/2013 | Park | ............ H05K 1/0209 362/612 |
| 2013/0258251 | A1* | 10/2013 | Lee | ............ H05K 1/0209 349/69 |
| 2014/0301107 | A1* | 10/2014 | Mizutani | ............ G02B 6/0091 362/612 |
| 2015/0369992 | A1* | 12/2015 | Song | ............ G02B 6/009 348/836 |

FOREIGN PATENT DOCUMENTS

| | | |
|---|---|---|
| CN | 101770112 A | 7/2010 |
| CN | 102346332 A | 2/2012 |
| CN | 102434824 A | 5/2012 |
| CN | 102661554 A | 9/2012 |
| JP | 2003-92020 A | 3/2003 |
| KR | 20070053517 A | 5/2007 |
| KR | 10-2008-0042432 | 5/2008 |
| KR | 10-1058564 B1 | 8/2011 |

* cited by examiner

LIQUID CRYSTAL DISPLAY DEVICE AND BACKLIGHT MODULE

RELATED APPLICATIONS

The present application is a National Phase of International Application Number PCT/CN2017/112697, filed Nov. 23, 2017, and claims the priority of China Application No. 201711146635.2, filed Nov. 17, 2017.

FIELD OF THE DISCLOSURE

The disclosure relates to a display technical field, and more particularly to a liquid crystal display device and a backlight module.

BACKGROUND

Currently, all screen will become the standard of high-end mobile phone, the border of the mobile phone is getting narrower, so the upper, lower, left and right borders of the display module have to be extremely narrow. Because the lower border (the LED side) has to keep a certain distance for light guiding, the difficulty of narrowing the lower border is increased, and the width of the conventional lower border is about 5 mm. As the requirements of the light source are higher, the area of the FPC of the light source is getting larger in order to dispose more LEDs, and the FPC of the light source is generally disposed on the top of the light guide plate. Therefore, the width of the FPC becomes a bottleneck of narrowing the lower border.

SUMMARY

A technical problem to be solved by the disclosure is to provide a liquid crystal display device and a backlight module to narrow the border of the liquid crystal display device, so the narrow border design of the liquid crystal display device could be achieved.

To achieve the above object, according to one aspect, the embodiment of the disclosure provides a backlight module, including:
 a light guide plate;
 a frame, including a lateral plate disposed opposite to a light incident surface of the light guide plate;
 a light source, including a flexible printed circuit and a LED, and the flexible printed circuit including a vertical portion and a first horizontal portion, wherein the vertical portion is disposed between the lateral plate and the light incident surface of the light guide plate, the LED is disposed on a surface of the vertical portion facing the light guide plate, and the first horizontal portion is a part of the vertical portion bending toward the light guide plate;
 a reflection layer, disposed on a bottom portion of the light guide plate; and
 an optical film set, disposed on a top portion of the light guide plate.

In an embodiment, the first horizontal portion extends to the top portion of the light guide plate.

In an embodiment, the first horizontal portion is perpendicular to the vertical portion.

In an embodiment, a surface of the first horizontal portion facing the light guide plate is coated with a reflection material.

In an embodiment, the backlight module further includes an adhesive layer disposed between the lateral plate and the vertical portion.

In an embodiment, the frame further includes a bottom plate, the bottom plate a part of the lateral plate bending toward the light guide plate, the flexible printed circuit further includes a second horizontal portion, the second horizontal portion is a part of the vertical portion bending toward the light guide plate, and the second horizontal portion and the first horizontal portion are respectively disposed on two sides of the light guide plate.

In an embodiment, the second horizontal portion extends to the bottom portion of the light guide plate.

In an embodiment, a surface of the second horizontal portion facing the light guide plate is coated with a reflection material.

In an embodiment, the bottom plate includes a connection portion and a step portion, the step portion is a part of the connection portion bending toward the light guide plate, and a length of the connection portion is larger than a length of the second horizontal portion.

According to another aspect, the embodiment of the disclosure provides a liquid crystal display device including an above-mentioned backlight module.

The embodiment of the disclosure provides the light source of the backlight module, including a flexible printed circuit and a LED, and the flexible printed circuit includes a vertical portion and a first horizontal portion, wherein the vertical portion is disposed between the lateral plate of the frame and the light incident surface of the light guide plate, the LED is disposed on a surface of the vertical portion facing the light guide plate, and the first horizontal portion is a part of the vertical portion bending toward the light guide plate. By designing the flexible printed circuit with the vertical portion and the first horizontal portion to avoid broadening the border of the liquid crystal display device due to the length of the first horizontal portion is too long, so the narrow border design of the liquid crystal display device could be achieved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
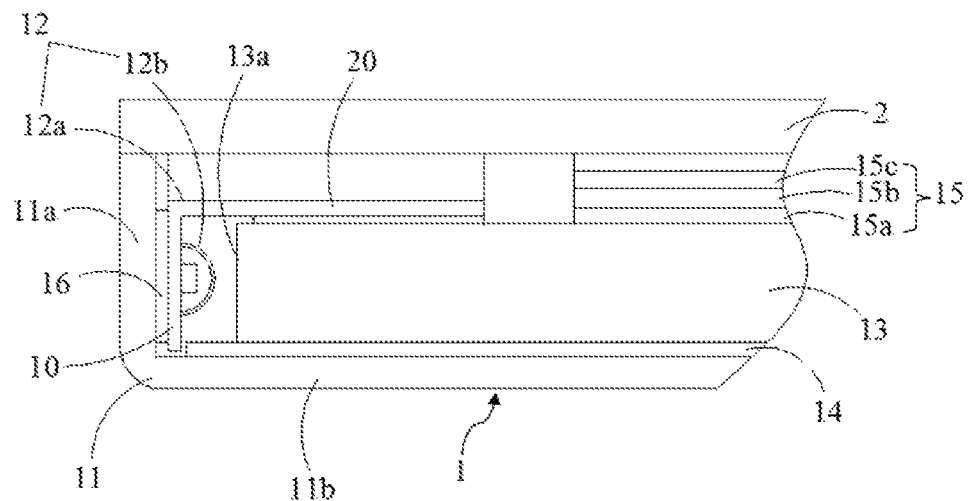
FIG. 1 is a structural schematic view of a liquid crystal display device according to Embodiment 1 of the disclosure.
Figure 2:
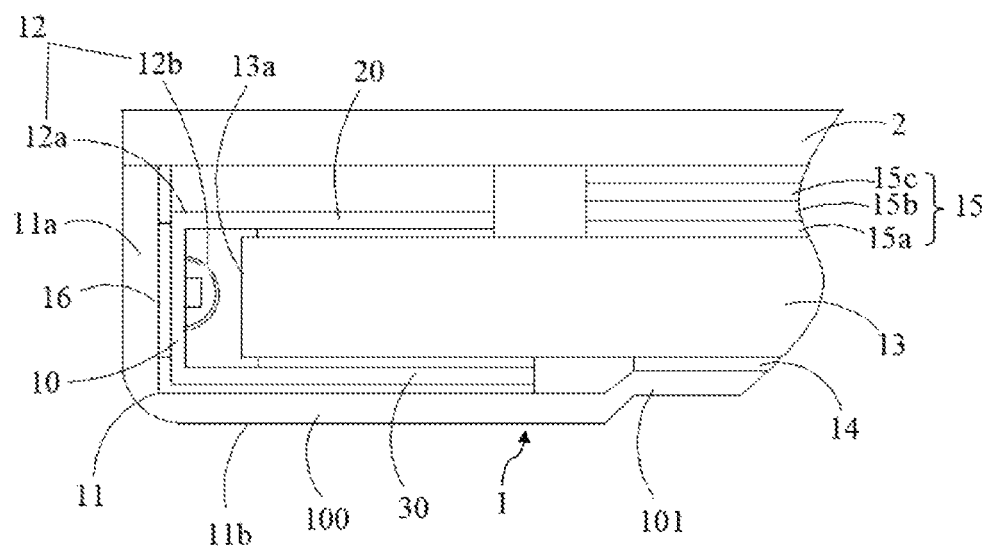
FIG. 2 is a structural schematic view of a liquid crystal display device according to Embodiment 2 of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Embodiment 1

Referring to FIG. 1, a liquid crystal display device provided by the embodiment includes a backlight module 1 and a display module 2, the display module 2 is disposed on the top of the backlight module 1, the backlight module 1 is configured to providing a light source of the display module 2.

The backlight module 1 includes a frame 11, a light source 12, a light guide plate 13, a reflection layer 14 and an optical film set 15. The frame 11 includes a lateral plate 11a disposed opposite to a light incident surface 13a of the light guide plate 13. The light source 12 includes a flexible printed circuit 12a and a LED 12b, and the flexible printed circuit 12a includes a vertical portion 10 and a first horizontal portion 20, wherein the vertical portion 10 is disposed between the lateral plate 11a and the light incident surface 13a of the light guide plate 13, the LED 12b is disposed on a surface of the vertical portion 10 facing the light guide plate 13, and the first horizontal portion 20 is a part of the vertical portion 10 bending toward the light guide plate 13. The reflection layer 14 is disposed on a bottom portion of the light guide plate 13, and the optical film set 15 is disposed on a top portion of the light guide plate 13. The light incident surface 13a of the light guide plate 13 is a surface of the light guide plate 13 facing the LED 12b.

The lateral plate 11a is configured to fix the vertical portion 10. The LED 12b is electrically connected to the vertical portion 10. The light emitted from LED 12b into the light guide plate 13 and reflected repeatedly in the light guide plate 13 then emits from a light emission surface of the light guide plate 13, the light emission surface of the light guide plate 13 is a surface of the light guide plate 13 opposite to the optical film set 15. The light emitted from the light emission surface of the light guide plate 13 will incident into the optical film set 15. Wherein, the light emitted to the bottom portion of the light guide plate 13 will be reflected by the reflection layer 14 to avoid the light emitting from the bottom portion of the light guide plate 13.

The first horizontal portion 20 extends to the top portion of the light guide plate 13. The first horizontal portion 20 is perpendicular to the vertical portion 10, and the first horizontal portion 20 is overlapped an edge of the top portion of the light guide plate 13, so a light shielding adhesive layer is not needed. Meanwhile, by designing the flexible printed circuit 12a with the vertical portion 10 and the first horizontal portion 20 to avoid broadening the border of the liquid crystal display device due to the length of the first horizontal portion 20 is too long.

In order to enhance the utilization rate of the light source 12, wherein a surface of the first horizontal portion 20 facing the light guide plate 13 is coated with a reflection material. The reflection material may be white oil or other material with high reflectivity. When the light emitted by the LED 12b incidents into the first horizontal portion 20, the light could be reflected into the light guide plate 13, so the light leakage from the top of the LED 12b could be avoided.

In this embodiment, the backlight module 1 may include an adhesive layer 16 disposed between the lateral plate 11a and the vertical portion 10, so the vertical portion 10 could be fixed on the lateral plate 11a via the adhesive layer 16.

The optical film set includes a bottom diffusion film 15a, a brightness enhancement film 15b and a top diffusion film 15c disposed sequentially from the bottom to the top. The top diffusion film 15c is disposed between the brightness enhancement film 15b and the display module 2, and the bottom diffusion film 15a is disposed between the brightness enhancement film 15b and the light guide plate 13. The bottom diffusion film 15a is configured to collect the light emitted from the light emission surface of the light guide plate 13 and project to the brightness enhancement film 15b uniformly. The brightness enhancement film 15b is configured to gather the light emitted from the bottom diffusion film 15a to enhance the brightness. The top diffusion film 15c is configured to emit the light emitted from the brightness enhancement film 15b uniformly.

In this embodiment, the frame 11 further includes a bottom plate 11b, the bottom plate 11b is a part of the lateral plate 11a bending toward the light guide plate 13, the bottom plate 11b is configured to support the backlight module 1.

In this embodiment, the reflection layer 14 could be a reflection sheet or a reflection coating on the bottom portion of the light guide plate 13. When the reflection layer 14 is the reflection sheet, the reflection layer 14 will extends to the bottom of the LED 12b in order to reflect the light emitted from the bottom of the LED 12b into the light guide plate 13.

The LED 12b includes an emitting chip and a transparent shade. The transparent shade packages the emitting chip. Wherein the emitting chip may be a white light chip, so the emitting chip will emit white light. The emitting chip may be a blue light chip, so the emitting chip will emit blue light.

When the emitting chip is the blue light chip, the LED 12b further includes a phosphor material coated on an inner surface of the transparent shade. The phosphor material may be a yellow phosphor, a red and green mixed phosphor, or a yellow and red mixed phosphor. The blue light emitted from the blue light chip will stimulate the phosphor material in order to emit the white light from the transparent shade.

Embodiment 2

The difference between this embodiment and Embodiment 1 is: the flexible printed circuit 12a further includes a second horizontal portion 30, the second horizontal portion 30 is a part of the vertical portion 10 bending toward the light guide plate 13.

The second horizontal portion 30 and the first horizontal portion 20 are respectively disposed on two sides of the light guide plate 13. The second horizontal portion 30 is parallel to the first horizontal portion 20. The second horizontal portion 30 extends to the bottom portion of the light guide plate 13, and the second horizontal portion 30 is overlapped an edge of the top portion of the light guide plate 13, so a light shielding adhesive layer is not needed, and the reflection layer 14 does not need to extend to the bottom of the LED 12b. By designing the flexible printed circuit 12a with the vertical portion 10, the first horizontal portion 20 and the second horizontal portion 30 to avoid broadening the border of the liquid crystal display device due to the length of the first horizontal portion 20 is too long.

In order to enhance the utilization rate of the light source 12, wherein a surface of the second horizontal portion 30 facing the light guide plate 13 is coated with a reflection material. The reflection material may be white oil or other material with high reflectivity. When the light emitted by the LED 12b incidents into the second horizontal portion 30, the light could be reflected into the light guide plate 13, so the light leakage from the top of the LED 12b could be avoided.

In this embodiment, the bottom plate 11b includes a connection portion 100 and a step portion 101, the step portion 101 is a part of the connection portion 100 bending toward the light guide plate 13, and a length of the connection portion 100 is larger than a length of the second horizontal portion 30. The step portion 101 could support the reflection layer 14 and decrease the thickness of the liquid crystal display device.

In this embodiment, all of the vertical portion 10, the first horizontal portion 20 and the second horizontal portion 30 is a single layer FPC.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A liquid crystal display device, comprising: a display module and a backlight module, wherein the backlight module comprises:
    a light guide plate;
    a frame, including a lateral plate disposed opposite to a light incident surface of the light guide plate;
    a light source, comprising a flexible printed circuit and a LED, and the flexible printed circuit including a vertical portion and a first horizontal portion, wherein the vertical portion is disposed between the lateral plate and the light incident surface of the light guide plate, the LED is disposed on a surface of the vertical portion facing the light guide plate, and the first horizontal portion is a part of the vertical portion bending toward the light guide plate;
    a reflection layer, disposed on a bottom portion of the light guide plate; and
    an optical film set, disposed on a top portion of the light guide plate;
    wherein the display module is disposed above the backlight module and connected to the lateral plate of the frame.

2. The liquid crystal display device according to claim 1, wherein the first horizontal portion extends to the top portion of the light guide plate.

3. The liquid crystal display device according to claim 2, wherein the first horizontal portion is perpendicular to the vertical portion.

4. The liquid crystal display device according to claim 2, wherein a surface of the first horizontal portion facing the light guide plate is coated with a reflection material.

5. The liquid crystal display device according to claim 1, further comprising an adhesive layer disposed between the lateral plate and the vertical portion.

6. The liquid crystal display device according to claim 1, wherein the frame further includes a bottom plate, the bottom plate is a part of the lateral plate bending toward the light guide plate, the flexible printed circuit further includes a second horizontal portion, the second horizontal portion is a part of the vertical portion bending toward the light guide plate, and the second horizontal portion and the first horizontal portion are respectively disposed on two sides of the light guide plate.

7. The liquid crystal display device according to claim 6, wherein the second horizontal portion extends to the bottom portion of the light guide plate.

8. The liquid crystal display device according to claim 7, wherein a surface of the second horizontal portion facing the light guide plate is coated with a reflection material.

9. The liquid crystal display device according to claim 6, wherein the bottom plate includes a connection portion and a step portion, the step portion is a part of the connection portion bending toward the light guide plate, and a length of the connection portion is larger than a length of the second horizontal portion.

* * * * *